United States Patent [19]

Hashimoto

[11] Patent Number: 5,557,135
[45] Date of Patent: Sep. 17, 1996

[54] SEMICONDUCTOR DEVICE WITH FIELD SHIELD ISOLATION STRUCTURE AND A METHOD OF MANUFACTURING THE SAME

[75] Inventor: Masayuki Hashimoto, Tateyama, Japan

[73] Assignee: Nippon Steel Semiconductor Corporation, Chiba-ken, Japan

[21] Appl. No.: 259,158

[22] Filed: Jun. 13, 1994

Related U.S. Application Data

[63] Continuation of Ser. No. 956,101, Oct. 2, 1992, abandoned.

[30] Foreign Application Priority Data

Oct. 17, 1991 [JP] Japan .................................. 3-298483

[51] Int. Cl.⁶ .................................................. H01L 29/00
[52] U.S. Cl. ............................................ 257/308; 257/506
[58] Field of Search ................................. 257/506, 508, 257/509, 510, 513, 495, 494, 339, 409, 490, 372, 925, 371

[56] References Cited

U.S. PATENT DOCUMENTS

| | | | |
|---|---|---|---|
| 4,493,740 | 1/1985 | Komeda | 257/501 |
| 4,825,278 | 4/1989 | Hillenius et al. | 257/925 |
| 4,925,805 | 5/1990 | van Ommen et al. | 257/347 |
| 5,097,310 | 3/1992 | Eimori et al. | 257/371 |

FOREIGN PATENT DOCUMENTS

| | | | |
|---|---|---|---|
| 61-290753 | 12/1986 | Japan | 257/925 |
| 2-98959 | 4/1990 | Japan | 257/508 |
| 2-172253 | 7/1990 | Japan | 257/508 |
| 2-211651 | 8/1990 | Japan | 257/508 |

*Primary Examiner*—Steven H. Loke

[57] ABSTRACT

To electrically isolate a MOSFET formed on a substrate from an electrical device, a field shield electrode is buried in a substrate between the MOSFET and the electrical device so that the bottom surface of the field shield electrode is at a level deeper than each of depth levels of diffusion layers of the MOSFET and the electric device. To provide such an electrode, a trench is formed in a substrate at a level deeper than the depth levels of the diffusion layers of both the MOSFET and the electric device. After insulating an entire inner surface of the trench, an field shield electrode is buried and exposed surface of the electrode is covered with an insulating film.

10 Claims, 4 Drawing Sheets

5,557,135

SEMICONDUCTOR DEVICE WITH FIELD SHIELD ISOLATION STRUCTURE AND A METHOD OF MANUFACTURING THE SAME

This is a continuation of application Ser. No. 07/956,101 filed Oct. 2, 1992, now abandoned.

BACKGROUND OF THE INVENTION

1. Field of the Invention

The present invention relates to a high density array of very small dimensional semiconductor devices electrically isolated one from the other with an improved field shield structure. The invention further relates to a method of manufacturing such an array of semiconductor devices.

2. Description of the Prior Art

Using LOCOS (local oxidation of silicon) is a typical method for electrically isolating very small dimensional semiconductor devices arrayed in a high density. However, LOCOS is not adequate when the semiconductor devices are to be isolated at an extremely short-interval therebetween, because the oxidized silicon layer formed by means of LOCOS method tends to penetrate into an adjoining active region existing in the substrate. This phenomenon is known as bird's beak. Recently, the field shield isolation technique has been receiving expert's attention and is considered to be replaced with LOCOS.

Principle of the field shield isolation will be briefly described with reference to FIG. 1 in which is shown an N-channel MOSFET isolated with a field shield electrode. In a P-well or P-type substrate 1 is formed an N-channel MOSFET having a source derived from an N-type impurity diffusion layer 2, a drain derived from the same type impurity diffusion layer 3, and a gate portion 10 having a gate electrode 5 disposed on an insulation layer 4 and a spacer 8. Such a MOSFET is electrically isolated from adjacent semiconductor device with a MOS structure made up of a field shield electrode 6, a field shield gate insulation layer 7 and the P-well or P-type substrate.

Since the field shield electrode 6 is grounded (0 volt), electrons are not induced in the surface of the substrate 1 beneath the field shield electrode 6. Therefore, electrical isolation of the MOSFET can be achieved. However, one of disadvantages with such a structure of the field shield electrode 6 is that when an interval of the isolation is as short as a sub-micron, a leak current is produced due to short-channel effect.

SUMMARY OF THE INVENTION

The present invention has been made to obviate the aforesaid disadvantage, and accordingly it is a primary object of the invention to ensure isolation of high-density arranged semiconductor devices using an improved field shield isolation structure.

Another object of the invention is to provide a manufacturing method of an array of semiconductor devices having an improved field shield isolation structure.

To achieve the above and other objects, there is provided an array of semiconductor devices in which a MOSFET and an electric device are formed in the surface of a semiconductor substrate adjacent to each other and a field shield electrode is formed between the MOSFET and the electric device for electrically isolating one from the other. The electrode is buried in the semiconductor substrate in a level deeper than a predetermined depth level of the bottom surface of first or second diffusion layer of the MOSFET. The electrical device, which may be a MOSFET, a capacitor or other device, includes a diffusion layer having a bottom surface of a second predetermined depth level down from the surface of said semiconductor substrate and the level in which the field shield electrode is buried is deeper than the second predetermined depth level.

In accordance with another aspect of the invention, there is provided a method of manufacturing an array of semiconductor devices including at least one MOSFET in a surface of a semiconductor substrate. In a first step, a trench is formed between the MOSFET and an electrical device formed adjacent to the MOSFET in the surface of the semiconductor substrate so that a bottom surface of the trench is at a level deeper than a depth level of a first diffusion layer of the MOSFET closer in position to the electrical device than a second diffusion layer of the MOSFET. In a second step, an entire inner surface of the trench is insulated. In a third step, an electrically conducting material serving as a field shield electrode is buried in the insulated trench. In a final step, an exposed surface of the conducting material is covered with an insulating film.

BRIEF DESCRIPTION OF THE DRAWINGS

The particular features and advantages of the invention as well as other objects will become apparent from accompanying drawls, in which.

DETAILED DESCRIPTION OF THE PREFERRED EMBODIMENTS

Figure 1:
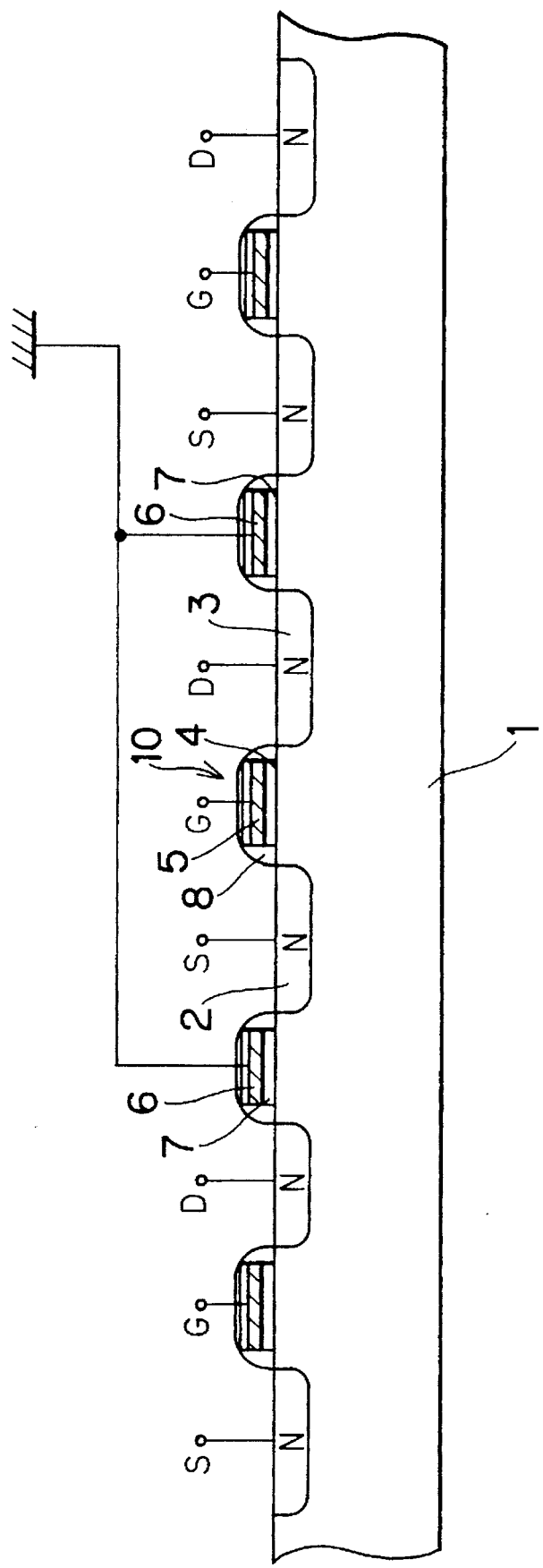
FIG. 1 is a vertical cross-sectional view showing a semiconductor/device isolated with a conventional field shield structure.
Figure 2:
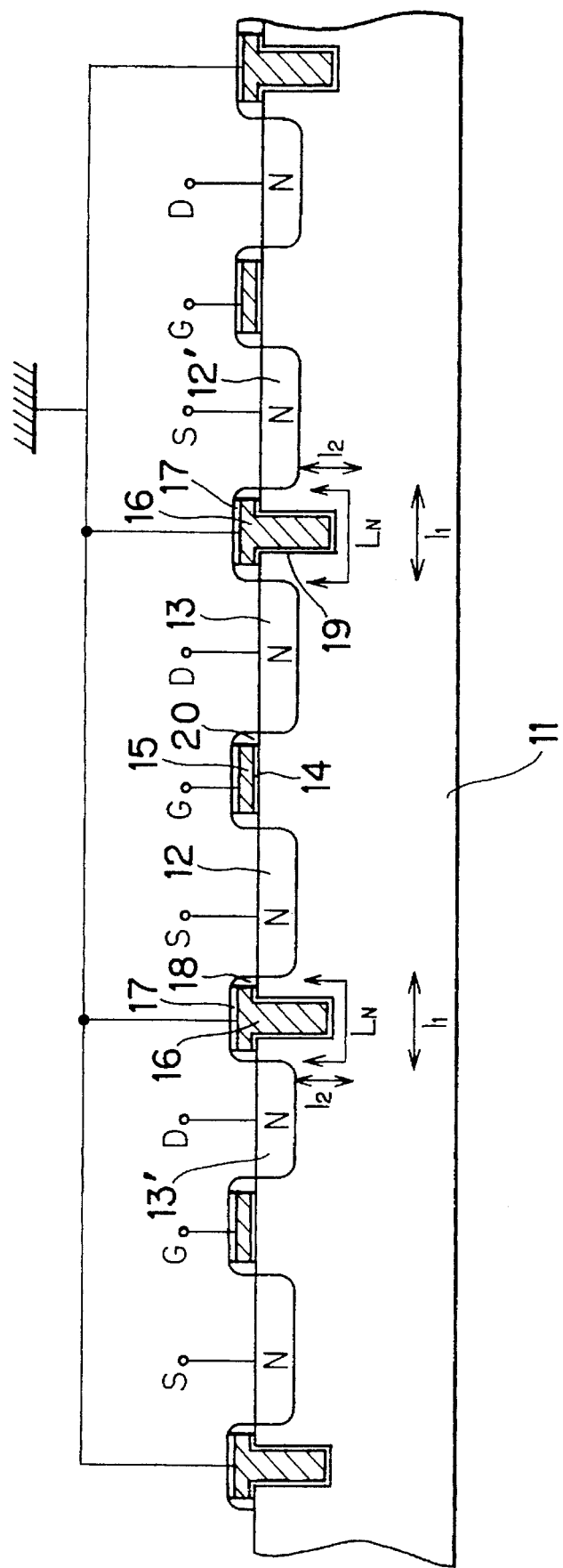
FIG. 2 is a vertical cross-sectional view showing a semiconductor device isolated with an improved field shield structure according to a first embodiment of the present invention.

Referring to FIG. 2, a first embodiment of the present invention will be described.

In a P-well or a semiconductor substrate 11 is formed an N-channel MOSFET which has a gate portion, a source and a drain. The source is derived from an N-type impurity diffusion layer 12 formed in the surface of the substrate 11, and the drain is derived from another same type impurity diffusion layer 13 formed in the surface of the substrate 11. A gate electrode 15 is disposed on an insulation layer 14. Another N-channel MOSFET is formed on the same substrate in an adjoining relation. These two MOSFETs are isolated from each other with a field shield structure. Specifically, the diffusion layers 12 and 13 are isolated from diffusion layers 13' and 12' of adjacent MOSFETs, respectively.

The source diffusion layer of one MOSFET and the drain diffusion layer of another MOSFET are arranged in a side-by-side fashion at an extremely short interval therebetween. To assure electrical isolation or insulation therebetween, a field shield electrode 16 is formed in the surface of the substrate 11 wherein the electrode 16 is buried in the substrate 11 in a level deeper than the depth levels of the source and drain diffusion layers. The field shield electrode 16 is of a doped polysilicon and is connected, when in use, to ground (0 volt). For P-channel MOSFETs, the field shield electrode 16 is connected, when in use, to a predetermined supply voltage (Vcc), not shown.

In terms of implementing an electrical isolation between two adjacent diffusion layers of different MOSFETs, an effective distance $L_N$ therebetween is given by a sum of a horizontal distance $l_1$ between the two adjacent diffusion layers and a double of vertical distance $l_2$ from the bottom surface of the diffusion layer to the lower surface of the field shield electrode 16, i.e., $L_N=l_1+2l_2$. Here, it is assumed that the two adjacent diffusion layers are of the same depth. It will be appreciated that with the structure of the present invention the effective distance $L_N$ is much 10 longer than an actual distance between the two diffusion layers measured on a two-dimensional plane.

Next, a manufacturing process of an array of semiconductor devices will be described with reference to FIGS. 3A through 3F.

Figure 3A:
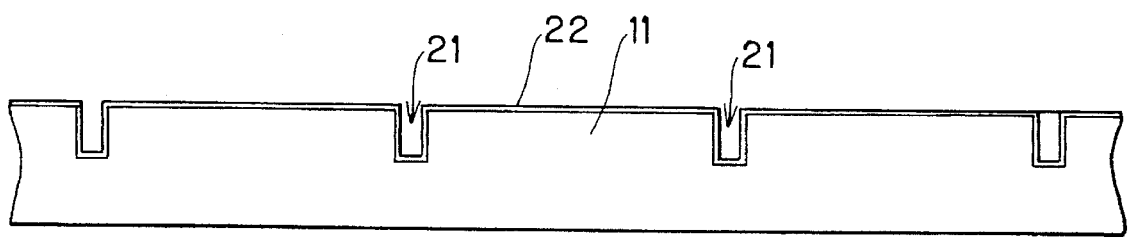
FIGS. 3A rough 3F show vertical cross-sectional views for illustrating a manufacturing process of an array of semiconductor devices acceding to the present invention.
Figure 3B:
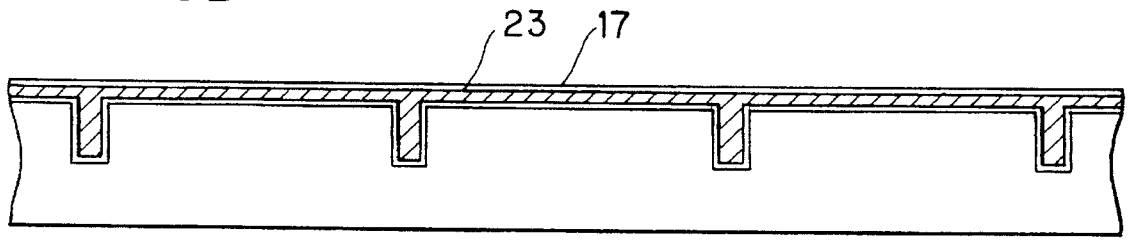

As shown in FIG. 3A, vertical-walled trenches of 6,000 Å width and 15,000 Å depth are formed in field shield isolation regions 21 on the P-type substrate 11 by means of photolithography and a dry etching using resist as a mask. A thermal oxide film 22 of 500 Å thickness is formed substantially uniformly over the exposed surface of the trench-formed substrate. Next, as shown in FIG. 3B, a phosphorus doped poly-silicon layer 23 of 3,000 Å thickness and a silicon oxide film 17 of 3,000 Å thickness are sequentially deposited by means of a CVD (chemical vapor deposition) method.

Figure 3C:
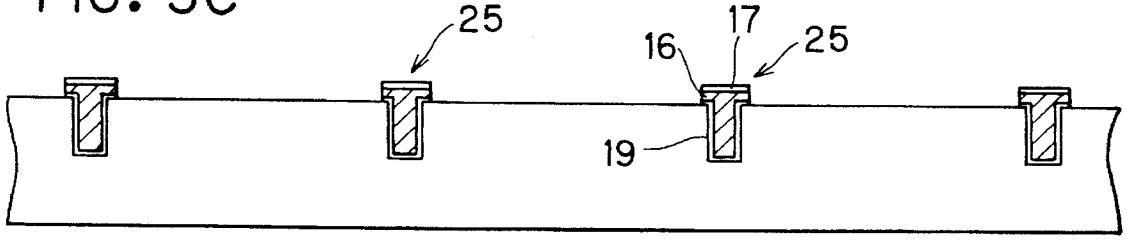
Figure 3D:
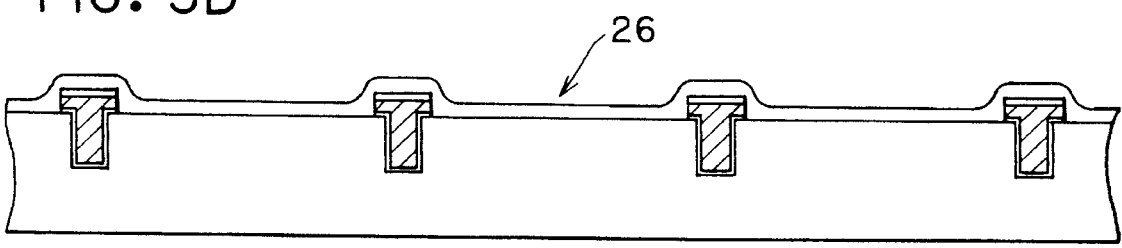
Figure 3E:
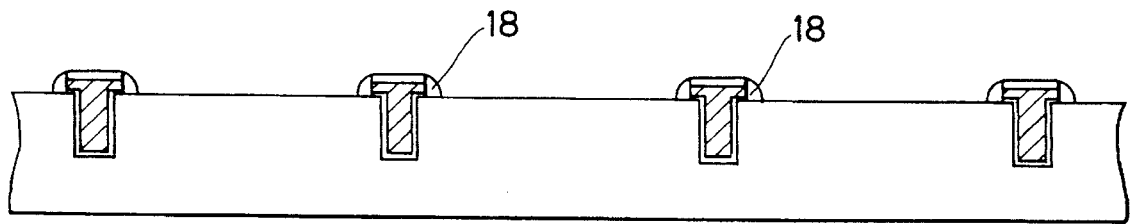
Figure 3F:
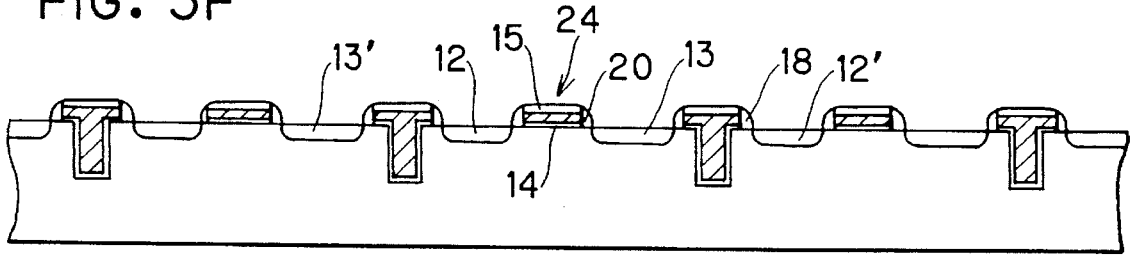

Next, as shown in FIG. 3C, a patterning is carried out to form the field shield structure 25. In the field shield structure 25, there are formed an oxide film 19, which is a part of the film 22, on the entire inner surface of the trench, a field shield electrode 16 buried in the trench, and an oxide film 17 on the exposed top surface of the field shield electrode 16. Then, as shown in FIG. 3D, a spacer oxide film 26 of 3,000 Å thickness is deposited over the field shield structure and the substrate surface by means of CVD method. As shown in FIG. 3E, the oxide film 26 thus deposited ed is etched away to remain spacer oxide films 18 in the field shield electrodes to thereby cover the entire exposed surface of the electrodes with the insulating materials. In the final stage, a gate portion 24 is configured as shown in FIG. 3F. In a portion surrounded by the field shield isolation regions, a gate oxide film 14, a phosphorus-doped poly-silicon gate electrode 15, and an oxide film are sequentially deposited one on the other in the stated order. A patterning is carried out to form the gate portion 24 having a spacer 20. Finally, arsenic (As) or boron (B) ions are implanted to form source diffusion layers 12, 12' and drain diffusion layers 13, 13'. These layers 12, 12', 13, 13' are either of N-type or P-type. The depth level of the layers of N-type is about 2,000 Å and that of the layers of P-type is about 3,000 Å.

In the manufacturing steps of the array shown in FIG. 3, the width and depth of the trench are in a range of from 2,000 to 20,000 Å and more than 2,000 Å, respectively. The thickness of the thermal oxide film 22 formed over the exposed surface of the trench-formed substrate is in a range of from 300 to 1,000 Å. Both the poly-silicon layer 23 and the silicon oxide film 17 are in a range of from 500 to 5,000 Å. The spacer oxide film 26 is in a range of from 1,000 to 4,000 Å.

In the present invention, while it is essential that the bottom surface level of the field shield electrode be in a level deeper than that of the source or drain diffusion layer, the isolation capability is enhanced if the field shield electrode is buried as deep as possible with respect to the bottom surface of the diffusion layer.

Figure 4:
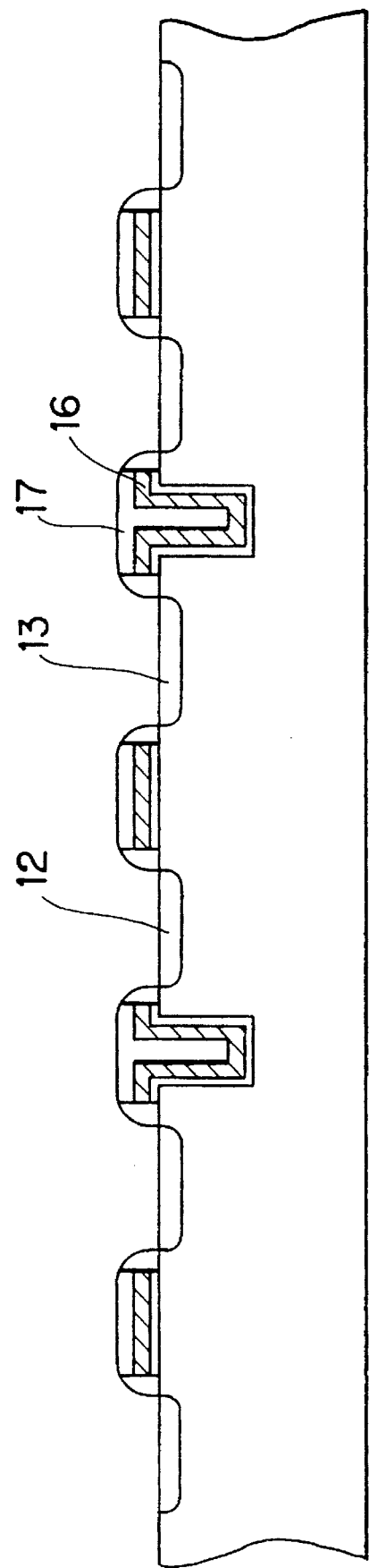
FIG. 4 is a vertical cross-sectional view showing a semiconductor device according to a second embodiment of the present invention.

While exemplary embodiments of this invention have been described in detail, those skilled in the art will recognize that there are many possible modifications and variations which may be made in these exemplary embodiments while yet retaining many of the novel features and advantages of the invention. Accordingly, all such modifications and variations are intended to be included within the scope of the appended claims. For example, in accordance with a second embodiment of the present invention as shown in FIG. 4, the full volume of trench may not necessarily be filled up with the field shield electrode but a small opening or groove may be formed in the electrode and filled with the oxide film 17. Further, the present invention is applicable not only to a case for isolating two adjacent MOSFETs one from the other but also to a case for isolating a MOSFET from an electrical device formed adjacent to the MOSFET in the substrate.

What is claimed is:

1. An array of semiconductor devices, comprising:

a semiconductor substrate having a surface;

a first MOSFET of a first conductivity channel type formed in the surface of said semiconductor substrate and including a first diffusion layer having a bottom surface of a first predetermined depth level down from the surface of said semiconductor substrate, a source derived from said first diffusion layer, a second diffusion layer having a bottom surface of substantially the same first predetermined depth level, a drain derived from said second diffusion layer, and a gate;

a second MOSFET of the same channel type as said first MOSFET formed adjacent to said first MOSFET in the surface of said semiconductor substrate, including a diffusion layer having a bottom surface of a second predetermined depth level down from the surface of said semiconductor substrate; and a field shield electrode formed in the surface of said semiconductor substrate for electrically isolating one of the first diffusion layer and the second diffusion layer of said first MOSFET from the diffusion layer of said second MOSFET, wherein said field shield electrode is buried in said semiconductor substrate in a level deeper than the first predetermined depth level and the second predetermined depth level, wherein the field shield electrode is connected to an electrically conductive wiring.

2. The array according to claim 1, wherein said field shield electrode is covered with an insulating material.

3. The array according to claim 2, wherein said first MOSFET is of an N-channel type and said field shield electrode is connected to ground.

4. The array according to claim 2, wherein said first MOSFET is of a P-channel type and said field shield electrode is connected to a terminal supplying a predetermined voltage.

5. An array of semiconductor devices, comprising:

a semiconductor substrate having a predetermined electrical conductivity type, the semiconductor substrate having a surface;

a first MOSFET of a first conductivity channel type formed in the surface of said semiconductor substrate and including a first diffusion layer having a bottom surface of a first predetermined depth level down from the surface of said semiconductor substrate, a source derived from said first diffusion layer, a second diffusion layer having a bottom surface of substantially the same first predetermined depth level, a drain derived from said second diffusion layer, and a gate;

a second MOSFET of the same channel type as said first MOSFET formed adjacent to said first MOSFET in the surface of said semiconductor substrate, including a diffusion layer having a bottom surface of a second predetermined depth level down from the surface of said semiconductor substrate; and a field shield electrode formed in the surface of said semiconductor substrate for electrically isolating one of the first diffusion layer and the second diffusion layer of said first MOSFET from the diffusion layer of said second MOSFET, wherein a part of said field shield electrode is buried in said semiconductor substrate in a level deeper than the first predetermined depth level and the second predetermined depth level, wherein the field shield electrode is connected to an electrically conductive wiring.

6. The array according to claim 5, wherein said part of said field shield electrode buried in said semiconductor substrate in a level deeper than the first predetermined depth level is surrounded by said semiconductor substrate.

7. The array according to claim 5, wherein said field shield electrode is surrounded by the semiconductor substrate below the surface of the semiconductor substrate.

8. The array according to claim 5, wherein said field shield electrode is covered with an insulating material.

9. The array according to claim 8, wherein said first MOSFET is of an N-channel type and said field shield electrode is connected to ground.

10. The array according to claim 8, wherein said first MOSFET is of a P-channel type and said field shield electrode is connected to a terminal supplying a predetermined voltage.

* * * * *